United States Patent
Cummings et al.

[11] Patent Number: 5,818,200
[45] Date of Patent: Oct. 6, 1998

[54] DUAL SMART BATTERY DETECTION SYSTEM AND METHOD FOR PORTABLE COMPUTERS

[75] Inventors: John Cummings; Jim Leftwich, both of Austin, Tex.

[73] Assignee: Dell U.S.A., L.P., Round Rock, Tex.

[21] Appl. No.: 851,781

[22] Filed: May 6, 1997

[51] Int. Cl.[6] .................................................. H01M 10/46
[52] U.S. Cl. ............................................ 320/116; 320/121
[58] Field of Search ........................................ 320/107, 110, 320/112, 116, 118, 120, 121, 126, 132, DIG. 21, 104, 105, 106, 114, 117; 307/66, 46, 48, 150

[56] References Cited

U.S. PATENT DOCUMENTS

| | | |
|---|---|---|
| 5,028,806 | 7/1991 | Stewart et al. . |
| 5,300,874 | 4/1994 | Shimamoto et al. . |
| 5,309,031 | 5/1994 | Stewart et al. . |
| 5,477,123 | 12/1995 | Allen et al. . |
| 5,485,073 | 1/1996 | Kasashima et al. . |
| 5,541,490 | 7/1996 | Sengupta et al. . |
| 5,573,869 | 11/1996 | Hwang et al. . |

*Primary Examiner*—Edward Tso
*Attorney, Agent, or Firm*—Haynes and Boone, L.L.P.

[57] ABSTRACT

A dual smart battery mutual detection system that utilizes intelligence built in to "smart batteries" in combination with a battery presence pin for enabling each battery of a dual battery power supply system of a PC to detect the presence, or, more importantly, the absence, of the other battery and to react accordingly is disclosed. In one embodiment, upon detection by the battery that is not being used to power the PC (the "inactive battery") of the removal of the battery that is being used to power the PC (the "active battery"), a microprocessor internal to the inactive battery closes an internal switch thereof, thereby causing the previously inactive battery to be "selected" and used to power the PC.

17 Claims, 1 Drawing Sheet

DUAL SMART BATTERY DETECTION SYSTEM AND METHOD FOR PORTABLE COMPUTERS

TECHNICAL FIELD

In one embodiment, the invention relates generally to "smart batteries" and, more particularly, to a system and method for enabling mutual detection of smart batteries in a portable computer.

BACKGROUND

Over the past several years, portable computers have become a popular alternative to traditional desktop computers. Portable computers are typically powered by rechargeable batteries or, in the alternative, by an AC adapter connected to an AC outlet. Often, it is desirable to operate a portable computer for lengthy periods where AC power is unavailable, for example, on an airplane or outdoors, in which case the computer must be powered solely by the batteries.

Although portable computers are smaller than desktop computers, and despite efforts to decrease the power consumption of portable computers, portable computers still consume a fairly significant amount of power during use. Under typical load conditions, rechargeable batteries that employ conventional electrolyte technologies, such as nickel-cadmium batteries, have a very short life, often as short as one hour. For obvious reasons, limited battery life imposes undesirable limitations on the effective use of a portable computer.

One solution to this problem has been to use in portable computers batteries that employ more sophisticated electrolyte technologies, such as nickel metal hydride and lithium ion batteries, that are know to provide substantially longer battery life than nickel-cadmium batteries. Unfortunately, batteries employing such electrolyte technologies are easily damaged by improper charging and therefore must be charged in accordance with very specific voltage and current specifications to prevent permanent damage thereto. Accordingly, these such batteries are typically used in connection with "smart battery" circuitry, which includes, in essence, a computer circuit the sole function of which is to monitor the performance of the battery and regulate the charging and discharging thereof to achieve maximum performance. The smart battery circuitry continually communicates with the computer or a charger connected to the battery to achieve these goals.

Another method of maximizing the amount of time a portable computer can be used in a battery-powered mode is to include in the power supply two batteries for use in supplying power to the computer. In such dual battery systems, only one of the batteries can be charged or discharged at any given time. Currently, this is accomplished by including in a dual battery system a "smart selector" circuit for ensuring that only the battery selected by the BIOS in accordance with various criteria is connected to be charged or discharged at a given time.

While smart selector circuits serve an important purpose, they suffer certain deficiencies. For example, smart selector circuits typically include several switches each including back-to-back FETs to control which battery is being charged or discharged, making it a fairly expensive circuit to implement. Moreover, if the user removes the battery being used to power the computer, it takes the smart selector circuit upwards of 30 microseconds to switch to the remaining battery, depending on the speed of the clock and the microprocessor within the smart selector circuit, potentially resulting in glitches in system operation.

Therefore, what is needed is a dual smart battery detection system and method for enabling mutual detection of smart batteries in a portable computer that is less expensive and more reliable than such systems and methods heretofore available.

SUMMARY

One embodiment of a dual smart battery mutual detection system utilizes intelligence built in to "smart batteries" in combination with a battery presence pin for enabling each battery of a dual battery power supply system of a PC to detect the presence, or, more importantly, the absence, of the other battery and to react accordingly. In particular, upon detection by the battery that is not being used to power the PC (the "inactive battery") of the removal of the battery that is being used to power the PC (the "active battery"), a microprocessor internal to the inactive battery closes an internal switch thereof, thereby causing the previously inactive battery to be "selected" and used to power the PC. Similarly, removal of a battery that is being charged is detected by the other battery such the latter will be "selected" and subsequently used to power to the PC as required.

A technical advantage is that, in instances in which the battery supplying power to the PC is removed, the dual smart battery mutual detection system enables almost instantaneous switching to the remaining battery.

Another technical advantage is that the dual smart battery mutual detection system is much less expensive to implement than a smart selector circuit, as the latter includes several more external switches than the former.

DESCRIPTION OF THE PREFERRED EMBODIMENT

Figure 1:
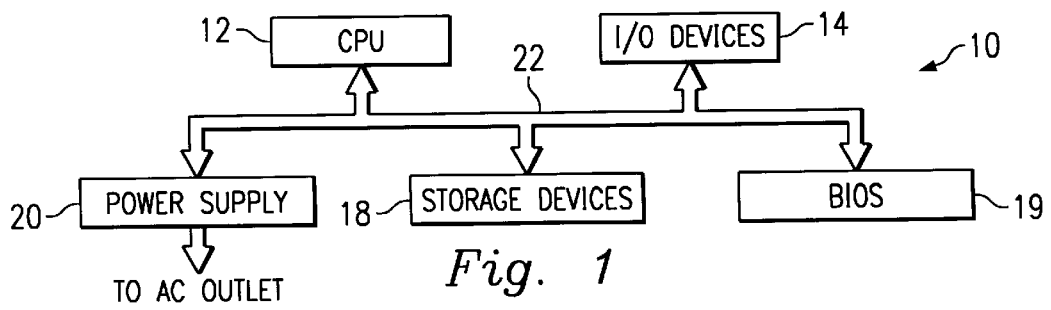
FIG. 1 is a system block diagram of a portable personal computer ("PC") embodying features of one embodiment of the present invention.

FIG. 1 is a system block diagram of a portable PC 10 embodying features of one embodiment of the present invention. In particular, the PC 10 includes a central processing unit ("CPU") 12, I/O devices, such as a display, a keyboard, a mouse, and associated controllers, collectively designated by a reference numeral 14, storage devices, such as a hard disk drive, a floppy disk drive, and memory, collectively designated by a reference numeral 18, system BIOS 19 and a power supply 20 all interconnected via one or more buses, shown collectively in FIG. 1 as a bus 22. The power supply 20 is connectable to an AC wall outlet (not shown) via an AC adapter (FIG. 3) for drawing operational power therefrom.

Figure 2:
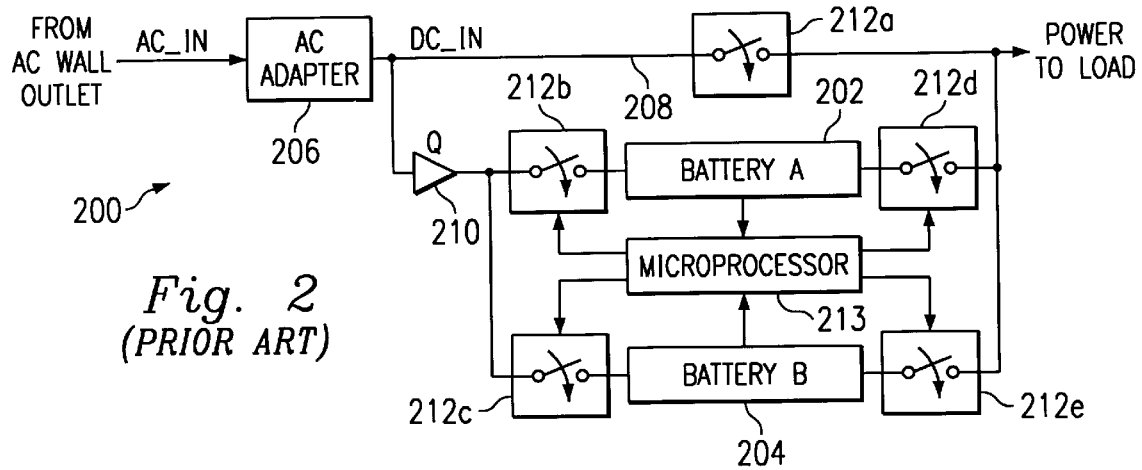
FIG. 2 is a schematic diagram of a power supply of a portable PC according to the prior art.

FIG. 2 is a schematic diagram of a prior art dual battery PC power supply 200 implemented using two rechargeable batteries 202 and 204 that may or may not be "smart batteries" as that term is commonly used. As shown in FIG. 2, the power supply 200 includes an AC adapter 206 for converting AC power from an AC wall outlet (not shown) to DC power output from the AC adapter 206 on a line 208, a charger 210 for charging the batteries 202, 204, using power output from the AC adapter on the line 206, several switches 212a, 212b, 212c, 212d, and 212e, each including a pair of back-to-back MOSFETs, and a microprocessor 213 for detecting the presence of the batteries 202, 204, and for actuating the switches 212b, 212c, 212d, and 212e. The switches 212b, 212c, 212d, and 212e, and the microprocessor 213 collectively comprising a smart selector circuit for controlling which battery 202, 204, is being charged or discharged at a given time.

During operation, when the power supply 200 is plugged into an AC wall outlet, the switch 212a will be closed and the switches 212d and 212e will be open such that power to the load, e.g., a portable PC, will be provided from the output of the AC adapter 206 on the line 208 rather than from the batteries 202, 204. In addition, closure of one of the switches 212b or 212c while the power supply 200 is plugged into the AC wall outlet will result in respective battery 202 or 204 being charged by the charger 210. Alternatively, when the power supply 200 is not plugged into the AC wall outlet, the switches 212a, 212b, and 212c will be open and one of the switches 212d or 212e will be closed, causing power to be supplied to the load from the respective one of the batteries 202 or 204.

It will be recognized that the microprocessor 213 detects which of the batteries 202, 204, are present and providing power. If both are present, the BIOS 19 selects the appropriate battery 202, 204, to be used to provide power. If and when that battery is removed, the microprocessor 213 actuates the appropriate switches 212a–212e so that the other battery is connected to provide power.

It will be recognized that at least five (5) switches external to the batteries 202, 204, are required (i.e., switches 212a, 212b, 212c, 212d, and 212e) for effecting charging and discharging of a selected one of the batteries 202, 204, making the circuit of FIG. 2 expensive, as well as wasteful when the batteries 202, 204, are smart batteries, as described in detail below.

Figure 3:
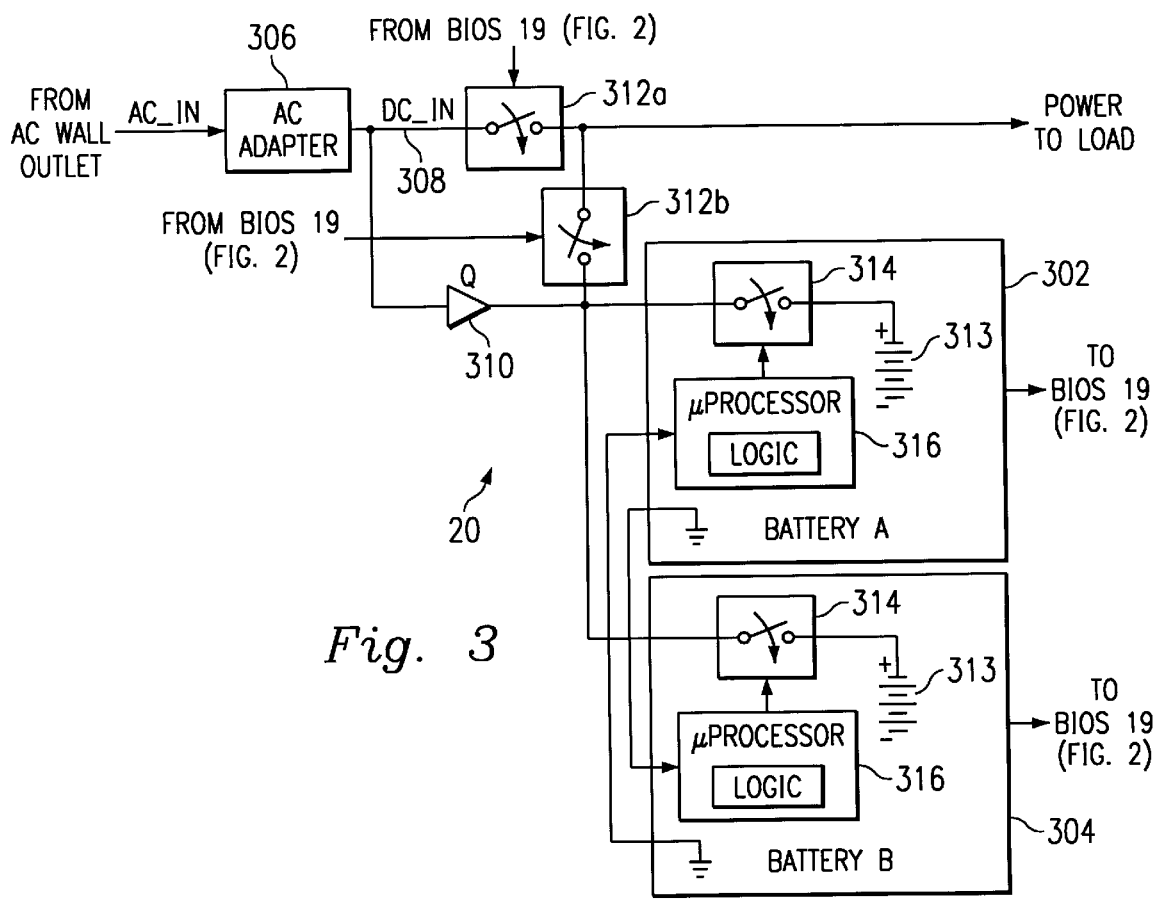
FIG. 3 is a schematic diagram of a power supply of the portable PC of FIG. 1.

FIG. 3 illustrates in greater detail the power supply 20 of FIG. 1. As shown in FIG. 3, the power supply 20 includes two smart rechargeable batteries 302, 304. Similar to the power supply 200, the power supply 20 includes an AC adapter 306 for converting AC power from an AC wall outlet (not shown) to DC power output on a line 308, and a charger 310 for charging the batteries 302, 304, using power output from the AC adapter 306 on the line 308. However, rather than five (5) external switches, the power supply 20 includes only two (2) external switches 312a and 312b each including a pair of back-to-back MOSFETs for controlling which battery 302, 304, is being charged or discharged at a given time.

Each of the batteries 302, 304, includes a cell 313, an internal switch 314 one terminal of which is connected to a positive terminal of the cell 313 and the other terminal of which is connected to a DC output of the battery 302, 304, and a microprocessor 316 for controlling the actuation of the internal switch 314, it being recognized that the microprocessor contains the necessary logic for implementing the features described herein. A battery present pin of each of the batteries 302, 304, is connected to a battery detect input of the microprocessor 316 of the other battery 302, 304, to indicate the presence of each battery to the other.

During operation, when the power supply 20 is plugged into an AC wall outlet, the switch 312a will be closed and the switch 312b will be open such that power to the load, e.g., the PC 10, will be provided from the output of the AC adapter 306 on the line 308 rather than from the batteries 302, 304. In addition, closure of the internal switch 314 of one of the batteries 302, 304, while the power supply 20 is plugged into the AC wall outlet will result in respective battery 302 or 304 being charged by the charger 310. Alternatively, if the power supply 20 is not plugged into the AC wall outlet, the switch 312a will be open, the switch 312b will be closed, and the internal switch 314 of the one of the batteries 302, 304, selected to power the PC 10 will be closed, while the internal switch 314 of the other of the batteries 302, 304, will be open. It will be recognized that the selection of one of the batteries 302, 304, to be charged or discharged is a function performed by the BIOS 19 of the PC 10 in a manner that is well known by those skilled in the art and therefore not further described in detail.

In accordance with a feature of one embodiment of the present invention, if at any point while the one of the batteries 302, 304, for example, the battery 302, being used to power the PC 10, is removed, its removal will be immediately indicated to the microprocessor 316 of the other battery, in this case, the battery 304, via the battery detection input thereof, at which point the microprocessor 316 of the battery that is still present closes the internal switch 314 thereof, such that power is now being supplied to the PC 10 by the remaining battery, i.e., the battery 304. It will be recognized that this detection and switching can take place within nanoseconds of the removal of one of the batteries 302, 304; that is, orders of magnitude faster than the circuit shown in FIG. 2.

Similarly, detection of the removal of one battery, such as the battery 302, by the other battery, the battery 304, while the former is being charged will result in the latter being "selected" for subsequent powering of the PC 10.

Accordingly, the power supply 20 of FIG. 3 takes advantage of the intelligence built into each of the batteries battery 302, 304, in the form of the internal switch 314 and the microprocessor 316, which has been heretofore used for preventing discharge of the battery below a minimum charge level and for cutting off charging of the battery upon reaching a maximum charge level, in combination with an additional battery presence pin to effectuate the necessary switching, thereby reducing the number of external switches from five (5) to two (2), making the power supply 20 (FIG. 3) significantly less expensive than the power supply 200 (FIG. 2).

Although an illustrative embodiment of the invention has been shown and described, other modifications, changes, and substitutions are intended in the foregoing disclosure. Accordingly, it is appropriate that the appended claims be construed broadly and in a manner consistent with the scope of the invention.

What is claimed is:

1. A power supply subsystem for supplying power to an electronic device, said power supply subsystem being connectable to an AC adapter for deriving power from an AC power source, said power supply subsystem comprising:

a pair of smart batteries each capable of being individually selected to be charged or discharged, wherein each of said smart batteries comprises an internal switch and a microprocessor for controlling actuation of said internal switch thereof and wherein selection of said smart battery is accomplished by actuation of said internal switch thereof;

a battery charger having an input electrically connectable to said output of said AC adapter and an output electrically connectable to charge a selected one of said smart batteries;

means for controlling electrical connection of said AC adapter and said smart batteries to said computer;

wherein each of said smart batteries is electrically connected to the other of said smart batteries such that removal of one of said smart batteries is immediately detected by the other of said smart batteries and causes said other of said smart batteries to be selected to be charged or discharged.

2. The power supply subsystem of claim 1 wherein said electronic device is a portable computer and said means for controlling comprises a BIOS of said portable computer.

3. The power supply subsystem of claim 1 wherein said smart batteries are selected from a group consisting of nickel metal hydride batteries and lithium ion batteries.

4. A power supply subsystem for supplying power to an electronic device, said power supply subsystem being connectable to an AC adapter for deriving power from an AC power source, said power supply subsystem comprising:

a pair of smart batteries each capable of being individually selected to be charged or discharged;

a battery charger having an input electrically connectable to said output of said AC adapter and an output electrically connectable to charge a selected one of said smart batteries;

means for controlling electrical connection of said AC adapter and said smart batteries to said computer, said means for controlling comprising:
a first control switch electrically connected between said AC adapter and said computer for controlling electrical connection of said AC adapter to said computer;
a second control switch electrically connected between said smart batteries and said computer for controlling electrical connection of said smart batteries to said computer; and
means for selectively actuating said first and second control switches;

wherein each of said smart batteries is electrically connected to the other of said smart batteries such that removal of one of said smart batteries is immediately detected by the other of said smart batteries and causes said other of said smart batteries to be selected to be charged or discharged.

5. The power supply subsystem of claim 4 wherein said first and second control switches are connected such that:

when said first and second control switches are open and said AC adapter is connected to said power supply, the selected one of said smart batteries is charged;

when said first control switch is open and said second control switch is closed, said selected one of said smart batteries is used to power the computer; and when said first control switch is closed and said second control switch is open, said AC power source is used to power the computer.

6. Apparatus for supplying power to an electronic device, said power supply subsystem being connectable to an AC adapter for deriving power from an AC power source, said power supply subsystem comprising:

two batteries each capable of being individually selected to be charged or discharged, wherein each of said batteries comprises an internal switch and a microprocessor for controlling actuation of said internal switch thereof and wherein selection of said battery is accomplished by actuation of said internal switch thereof;

means for selectively charging a selected one of said batteries;

means for controlling electrical connection of said AC adapter and said batteries to said computer;

wherein each of said batteries is electrically connected to the other of said batteries such that removal of one of said batteries is immediately detected by said other of said batteries and causes said other of said batteries to be selected to be charged or discharged.

7. The apparatus of claim 6 wherein each of said batteries is electrically connected to said microprocessor of the other of said batteries such that removal of one of said batteries is immediately detected by said microprocessor of the remaining battery, said microprocessor of said remaining battery closing said internal switch of said remaining battery responsive to said detection.

8. Apparatus for supplying power to an electronic device, said power supply subsystem being connectable to an AC adapter for deriving power from an AC power source, said power supply subsystem comprising:

two batteries each capable of being individually selected to be charged or discharged;

means for selectively charging a selected one of said batteries;

means for controlling electrical connection of said AC adapter and said batteries to said computer, said means for controlling comprising:
a first control switch electrically connected between said AC adapter and said computer for controlling electrical connection of said AC adapter to said computer;
a second control switch electrically connected between said batteries and said computer for controlling electrical connection of said batteries to said computer; and
means for selectively actuating said first and second control switches wherein each of said batteries is electrically connected to the other of said batteries such that removal of one of said batteries is immediately detected by said other of said batteries and causes said other of said batteries to be selected to be charged or discharged.

9. The apparatus of claim 8 wherein said first and second control switches are connected such that:

when said first and second control switches are open and said AC adapter is connected to said power supply, the selected one of said batteries is charged;

when said first control switch is open and said second control switch is closed, said selected one of said batteries is used to power the computer; and when said first control switch is closed and said second control switch is open, said AC power source is used to power the computers.

10. A computer having a dual smart battery detection system, the computer comprising:

a central processing unit ("CPU");

at least one memory device;

a power supply for supplying operating power to said computer; and an AC adapter having an input electrically connectable to an AC power supply and an output electrically connectable to said computer; and wherein said power supply comprises:
a pair of smart batteries each capable of being selected to be charged or discharged;
a charger having an input electrically connectable to said output of said AC adapter and an output electrically connectable to charge a selected one of said smart batteries;

a first control switch electrically connected between said AC adapter and said computer for controlling electrical connection of said AC adapter to said computer;

a second control switch electrically connected between said smart batteries and said computer for controlling electrical connection of said smart batteries to said computer;

wherein each of said smart batteries is electrically connected to the other of said smart batteries such that removal of one of said smart batteries is immediately detected by the other of said smart batteries and causes said other of said smart batteries to be selected to be charged or discharged.

11. The computer of claim 10 wherein said first and second control switches are connected such that:

when said first and second control switches are open and said AC adapter is connected to said power supply, the selected one of said smart batteries is charged;

when said first control switch is open and said second control switch is closed, said selected one of said smart batteries is used to power the computer; and when said first control switch is closed and said second control switch is open, said AC power source is used to power the computer.

12. The computer of claim 10 wherein each of said smart batteries comprises an internal switch and a microprocessor for controlling actuation of said internal switch, wherein selection of said smart battery is accomplished by closing said internal switch thereof.

13. The computer of claim 12 wherein each of said smart batteries is electrically connected to said microprocessor of the other of said smart batteries such that removal of one of said smart batteries is immediately detected by said microprocessor of the remaining smart battery, said microprocessor of said remaining smart battery closing said internal switch of said remaining smart battery responsive to said detection.

14. The computer of claim 10 wherein said smart batteries are selected from a group consisting of nickel metal hydride batteries and lithium ion batteries.

15. A power supply subsystem for supplying power to an electronic device, said power supply subsystem being connectable to an AC adapter for deriving power from an AC power source, said power supply subsystem comprising:

a pair of smart batteries each capable of being individually selected to be charged or discharged, wherein each of said smart batteries comprises an internal switch and a microprocessor for controlling actuation of said internal switch, wherein selection of said smart battery is accomplished by closing said internal switch thereof and wherein each of said smart batteries is electrically connected to said microprocessor of the other of said smart batteries such that removal of one of said smart batteries is immediately detected by said microprocessor of the remaining smart battery, said microprocessor of said remaining smart battery closing said internal switch of said remaining smart battery responsive to said detection;

a battery charger having an input electrically connectable to said output of said AC adapter and an output electrically connectable to charge a selected one of said smart batteries;

means for controlling electrical connection of said AC adapter and said smart batteries to said computer;

wherein each of said smart batteries is electrically connected to the other of said smart batteries such that removal of one of said smart batteries is immediately detected by the other of said smart batteries and causes said other of said smart batteries to be selected to be charged or discharged.

16. In a dual smart battery power supply subsystem for supplying power to an electronic device, a method of detecting removal of one of said smart batteries comprising:

providing a connection between said smart batteries for enabling a first one of said smart batteries to detect removal of said second smart battery;

providing a connection between said smart batteries for enabling said second one of said smart batteries to detect removal of said first one of said smart batteries;

responsive to detection by one of said smart batteries of the removal of the other one of said smart batteries, said one of said smart batteries selecting itself for providing power to said electronic devices;

wherein each of said smart batteries comprises an internal switch and a microprocessor for controlling actuation of said internal switch such that said smart battery is selected by said microprocessor thereof actuating said internal switch thereof, and wherein said selecting comprises said microprocessor of said one of said smart batteries closing said internal switch thereof.

17. In a dual smart battery power supply subsystem for supplying power to an electronic device, a method of detecting removal of one of said smart batteries comprising:

providing a connection between said smart batteries for enabling a first one of said smart batteries to detect removal of said second smart battery;

providing a connection between said smart batteries for enabling said second one of said smart batteries to detect removal of said first one of said smart batteries;

responsive to detection by one of said smart batteries of the removal of the other one of said smart batteries, said one of said smart batteries selecting itself for providing power to said electronic device;

wherein each of said smart batteries comprises an internal switch and a microprocessor for controlling actuation of said internal switch such that said smart battery is selected by said microprocessor thereof actuating said internal switch thereof, and wherein said selecting comprises said microprocessor of said one of said smart batteries closing said internal switch thereof; and wherein each of said smart batteries is electrically connected to said microprocessor of the other of said smart batteries such that removal of one of said smart batteries is immediately detected by said microprocessor of the remaining smart battery, said microprocessor of said remaining smart battery closing said internal switch of said remaining smart battery responsive to said detection.

* * * * *